(12) United States Patent
Corliss et al.

(10) Patent No.: US 7,351,348 B2
(45) Date of Patent: Apr. 1, 2008

(54) EVAPORATION CONTROL USING COATING

(75) Inventors: Daniel A. Corliss, Hopewell Junction, NY (US); Dario L. Goldfarb, Mohegan Lake, NY (US); Steven J. Holmes, Guilderland, NY (US); Kurt R. Kimmel, Waterford, NY (US); Michael J. Lercel, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/161,630

(22) Filed: Aug. 10, 2005

(65) Prior Publication Data

US 2007/0034605 A1 Feb. 15, 2007

(51) Int. Cl.
*B44C 1/22* (2006.01)
(52) U.S. Cl. .............................. 216/83; 216/85; 257/40; 428/622; 428/447; 355/53; 355/55; 355/63
(58) Field of Classification Search .................. 216/83; 257/40; 355/53; 428/622
See application file for complete search history.

(56) References Cited

U.S. PATENT DOCUMENTS 4,413,074 A 11/1983 Wrasidlo et al.
6,680,263 B2 * 1/2004 Morales et al. ............. 438/781
6,954,256 B2 * 10/2005 Flagello et al. ............... 355/53
2004/0175595 A1 * 9/2004 Heath et al. ................ 428/622

OTHER PUBLICATIONS

Kunz, Journal of Microlithography and Microfabrication, vol. 3, pp. 73-83, Jan. 2004.*
Internal Chemical Safety Cards for 1-Butanol pp. 1-3.*
Internal Chemical Safety Cards for 1-Butanol pp. 1-3 (2003).*
"Langmuir-Blodgett film", http://64.233.167.10.../0,,sid9_gci517746,00.html+langmuir+film&h1=en&is=UTF-4/4/05, pp. 1-3.

* cited by examiner

*Primary Examiner*—Duy-Vu N. Deo
*Assistant Examiner*—Maki Angadi
(74) *Attorney, Agent, or Firm*—Scully, Scott, Murphy & Presser, P.C.; Wenjie Li, Esq.

(57) ABSTRACT

A novel arrangement and method for depositing evaporation control agents so as to coat immersion lithographic solutions which are employed on the surface of semiconductor wafers in connection with the etching of the surfaces of the wafer through the intermediary of an immersion lithographic process.

7 Claims, 2 Drawing Sheets

EVAPORATION CONTROL USING COATING

BACKGROUND OF THE INVENTION

1. Field of the Invention

The present invention relates, in general, to the manufacture of integrated circuit devices, and in specific particularity, pertains to the technology of immersion lithography, which is employed in the etching of semiconductor wafers which are utilized in the electronics industry. Moreover, pursuant to further aspects, the present invention is directed to the provision of a novel arrangement for depositing evaporation control agents to coat immersion lithographic solutions which are employed on the surface of semiconductor wafers in connection with the etching of the surfaces of the wafer through the intermediary of an immersion lithographic process.

The etching of the surfaces of semiconductor wafers or chips, which are employed in the electronics industry, has been implemented in numerous and diverse technological modes in the industry; for instance, such as through mechanical, electromechanical or chemical etching processes or treatments. More recently, the industry has shifted its focus to emphasize the process of immersion lithography in comparison with other lithographic solutions, which are currently employed in the etching of the semiconductor wafer surfaces, whereby it is imperative to be able to provide appropriate and satisfactory optical properties to the surfaces of the semiconductor wafers during the lithographic etching processes which are imparted thereto.

In the implementing of liquid immersion lithography, as employed in the surface etching of semiconductor wafers, it is undesirable and highly detrimental to the quality of the etching to permit the liquid which is applied to the wafer surface to prematurely evaporate inasmuch as the evaporation of the liquid will cause any contaminants or residues contained therein to resultingly remain and adhere to the wafer surface. This will, in effect, adversely affect the quality of the optics required for the etching and also impart deleterious effects to subsequent processing steps utilized in the manufacture of electronic devices in which the semiconductor wafers or chips are installed.

2. Discussion of the Prior Art

Wrasidlo, et al., U.S. Pat. No. 4,413,074 disclose a method of coating filters hydrophobic polymers with a surfactant/cellulose mixture in order to render them hydrophilic. The method and materials disclosed in that patent are not applicable to the immersion lithography evaporation controlling coating pursuant to the invention, but describe a mixture of a surfactant and effectively a solvent so as to facilitate a more effective coating of a polymer surface.

SUMMARY OF THE INVENTION

Accordingly, it is of importance to be able to inhibit or at the very least to retard any evaporation of the immersion liquid, for instance such as water, which is employed in immersion lithography by incorporating additives in the water, which do not alter and possibly adversely affect the optical qualities of the liquid, but which, nevertheless, impart properties which will retard and/or inhibit the evaporation of the liquid. The additives, which form an evaporation control layer, may either be self-deposited onto the wafer surface by the immersion liquid or, alternatively, deposited as a thin layer after the exposure has passed over the surface of the wafer which is subject to being etched. The additive, which forms the evaporation inhibiter, and which is incorporated into the immersion liquid, such as the water used in immersion lithography, may be constituted of any number of suitable chemical materials, as discussed hereinbelow, and may also be dispensed into the immersion liquid on the wafer surface through diverse methods of application.

For instance, the control additive or evaporation-inhibiting agent may be dissolved in the immersion liquid or water prior to the latter being imparted to the surface of the semiconductor wafer. Alternatively, the evaporation-inhibiting agent may be precedingly introduced into the liquid or water through the intermediary of a dedicated nozzle, or through another mode delivered onto the surface of the wafer which is to be etched, in the form of a spray or vapor prior to being admixed with the liquid or water.

Accordingly, it is an object of the present invention to provide a novel method of imparting an evaporation controlling or inhibiting agent or additive to a liquid, such as water utilized in the immersion lithographic etching of semiconductor wafers.

It is another object of the present invention to provide a method for retarding the evaporation of surface coating liquids, which are employed in immersion lithography implemented on semiconductor wafers, and which will inhibit or retard the evaporation of the liquid during and subsequent to the etching process.

Yet another object of the present invention resides in the provision of a nozzle arrangement which is adapted to implement the deposition of an evaporation control liquid deposited or coated onto the surface of a semiconductor wafer during an immersion lithography etching process.

A further object of the present invention resides in the provision of a nozzle arrangement for implementing the formation of an LB (Langmuir-Blodgett) type film from an immersion liquid, which is applied to the surface of a semiconductor wafer which is being etched immersion lithographically.

BRIEF DESCRIPTION OF THE DRAWINGS

Reference may now be made to the following detailed description of preferred embodiments of the invention, taken in conjunction with the accompanying drawings; in which.

DETAILED DESCRIPTION OF THE INVENTION

Figure 1A:
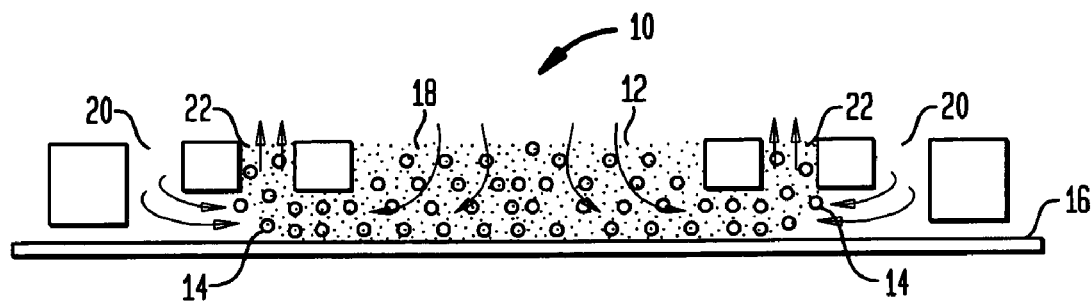
FIGS. 1A through 1C generally diagrammatically disclose various delivery systems for applying evaporation inhibiting agents to an immersion liquid being deposited onto the surface of a semiconductor wafer which is in the process of being subjected to immersion lithographic etching.

Referring in specific detail to the invention, in essence, the process of the immersion lithography employed for etching the surface of a semiconductor wafer or of a semiconductor chip, is implemented, ordinarily, with an immersion liquid or fluid, for instance, such as water, being deposited upstream of a lens slit or optical arrangement, by means of which the required images or patterns are printed onto the wafer or chip surface through the immersion liquid. After the printing of the etching pattern is completed by scanning through the lens slit or optical arrangement, the immersion liquid is normally aspirated from the wafer surface through the application of a suitable vacuum. In order to retard or inhibit any premature vaporization of the essentially heated liquid or water, an agent or solution which forms an evaporation control layer or coating, is deposited after most or all of the liquid or water has been aspirated and thus removed from the wafer surface. Consequently, if a resist surface, which is present on the wafer, is hydrophilic in nature, either fully or partially, a few monolayers of water may remain on the wafer surface. The evaporation control layer or coating is deposited over these layers, which then traps the water on the wafer surface until a rinsing action is implemented in a subsequent process step. Consequently, it is desirable that the control layer or coating is not in itself easily evaporated, such as by imparting the property of a high boiling point thereto while being easily removed during a subsequent rinsing step, and thereby forming a thin layer on the surface of the water or immersion liquid.

The simplest control or coating film is a simple hydrocarbon based light oil. An example thereof is hexadecane ($C_{16}H_{34}$) possessing a boiling point of 287° C., a melting point of 18° C., and a density of ~0.77/cm3 (less than water). Most light machine oils are a mixture of alkanes and there is no special reason for employing hexadecane; for instance, lighter materials, such as decane $C_{10}H_{22}$ could be substituted for a lower viscosity, or heavier materials could be substituted if more evaporation control is needed. Perfluorinated materials such as perfluoro-hexane have similar physical properties; in that generally the boiling and melting points are much higher than for equivalent hydrocarbons, but provide an even more hydrophobic surface. An ideal coating material can be perfluorinated 1-octanol $CF_3-(CF_2)_6-CF_2OH$ which possesses a small hydrophilic tail that is attracted to the immersion liquid or water layer. In that case, perfluoro-1-octanol possesses a boiling point of 164° C. The fluorinated materials are commercially available from Exfluor (Round Rock Tex.) or other fluorocarbon suppliers. The length of the hydrocarbon (or fluorocarbon) chain is not critical to the coating property and can be easily selected to achieve the correct boiling and melting points. Moreover, these oils can be dissolved in organic solvents (such as alcohols), if needed. In addition, materials that provide similar properties include surfactants which are based on acetylenic dials. These materials are commercially available from Air Products under the Surfynol brand, and typically have boiling points of ~250° C., or possibly between 200° C. to 300° C.; or in any event higher than that of water at ambient conditions.

Figure 1B:
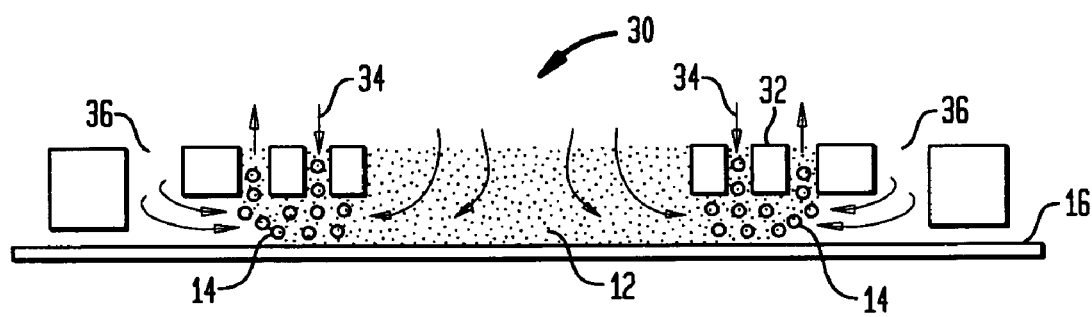
Figure 1C:
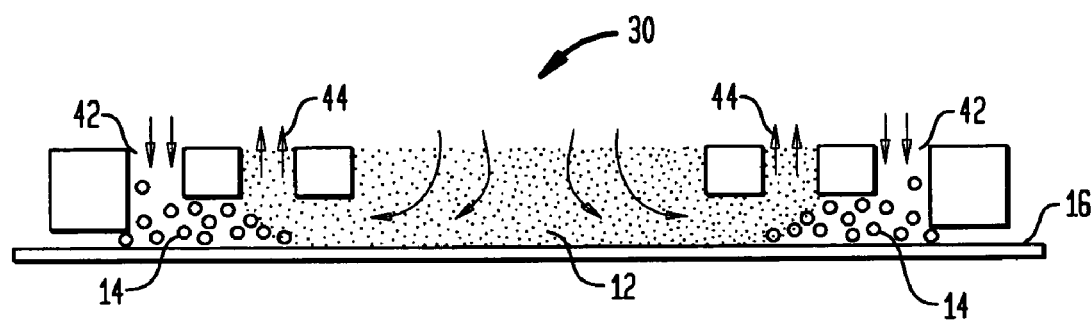

In order to impart the evaporation control or vaporization inhibiting agent to the immersion liquid and to the surface of the wafer, various concepts may be employed in the implementation of a delivery system, as diagrammatically represented in FIGS. 1A through FIGS. 1C of the drawings, wherein similar or identical elements are identified with the same reference numerals.

As illustrated through a delivery system 10 shown in FIG. 1A of the drawings, immersion liquid 12, such as water, has a vapor evaporation control agent or chemical 14 of the type as described hereinabove imparted thereto so as to inhibit evaporation of the heated liquid or water, as the latter has the wafer surface 16 passed therebeneath. As shown in FIG. 1A, the control agent 14 is infused into the heated liquid 12 through a central opening 18 so as to be dissolved in the immersion liquid, with a surrounding flow of air 20 providing an assist in maintaining the agent-infused liquid 12 in contact with the wafer surface 16, thereby increasing the boiling point and inhibiting any premature vaporization or evaporation of the liquid or water 12 during the etching step which is imparted to the wafer surface through an optical device or lens slit (not shown). The liquid 12 containing the vaporization control agent or chemical 14 dissolved therein is recovered (and may be recirculated) through one or more suitable apertures 22.

In the modified delivery system 30, as shown in FIG. 1B of the drawings, the evaporation inhibiting or control agent or chemical 14 is provided utilizing a dedicated nozzle structure 32 so as to be delivered through one or more suitable orifices or passages 34 into the immersion liquid or water 12, with an airflow extending thereabout through inlet 36, thereby preventing premature evaporation of the immersion liquid or water when heated by raising the boiling point of the latter. As in FIG. 1A, the wafer surface 16 is passed in contact with the liquid 12, which has the agent 14 delivered thereto through the nozzle structure 32.

Pursuant to the delivery system 40, as indicated in FIG. 1C of the drawings, the chemical evaporation inhibiting or control agent 14 is delivered in the form of a spray or vapor through one or more suitable apertures 42 while entrained in an airflow so as to contact the surface 16 of the wafer and to resultingly inhibit any premature evaporation or vaporization of the water or liquid 12, which is in contact with the wafer surface 16, and may be recirculated through one or more liquid recovery apertures 44. This is implemented by means of the airflow which introduces the spray or vapor of chemical agent 14 into the immersion liquid while surrounding the latter and in contact with the surface of the wafer.

As represented in FIGS. 2 to 5 of the drawings, various alternative nozzle structures are provided for inventively imparting or delivering evaporation control agents or chemicals to the immersion liquid in order to inhibit the premature evaporation thereof during and after the etching process which is implemented through an optical lens slit or arrangement located above the surface of the wafer.

Figure 2:
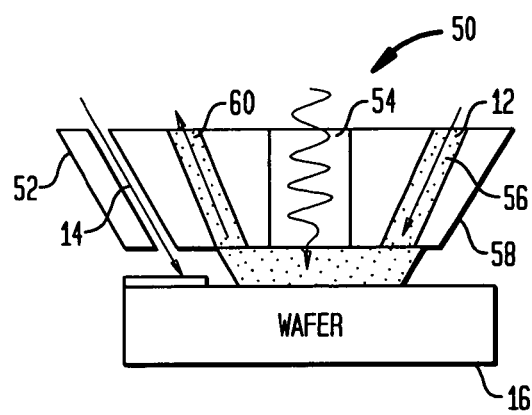
FIG. 2 illustrates diagrammatically a nozzle structure for the deposition of evaporation control or inhibiting fluid as a thin liquid or as a condensed vapor onto a semiconductor wafer.

Referring in particular to FIG. 2 of the drawings, there is illustrated a nozzle arrangement 50 for the deposition of evaporation control agents or chemicals 14 from a first separate spray nozzle 52 onto the surface 16 of the wafer while the latter is subjected to an etching process through an optical lens slit 54. Immersion lithographic liquid, such as water 12, is concurrently directed onto the surface of the wafer through at least one orifice 56 of a second nozzle 58, and discharged from at least one further orifice 60, with the evaporation control fluid or chemical 14 in liquid 12 then essentially forming a thin liquid film or condensed vapor from the spray nozzle 52 over the wafer surface 16.

Figure 3:
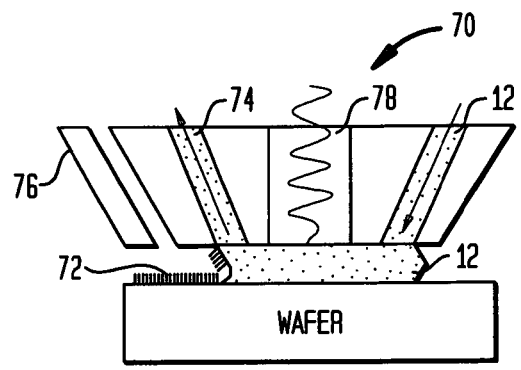
FIG. 3 illustrates diagrammatically another nozzle arrangement for the deposition of an LB type film from an immersion liquid surface onto a semiconductor wafer during immersion lithographic etching.

In a modified embodiment of a nozzle arrangement 70, which is similar to nozzle arrangement 50, as illustrated in FIG. 3 of the drawings there is implemented a deposition of an LB (Langmuir-Blodgett) type film 72 from the immersion liquid 12, wherein a nozzle, similar to that of FIG. 2 of the drawings, has the immersion lithographic liquid 12 contacting the surface of the wafer, and then aspirated/recycled through at least one further orifice 74, through a vacuum and water suctioning being applied thereto. Concurrently therewith, the preparation control agent or chemical 14 is introduced through a nozzle 76, so as to form the LB type film on the liquid 12 on the surface 16 of the wafer, which will inhibit the underlying layer of water from being prematurely evaporated prior to the implementing of a rinsing step subsequent to the step of wafer surface etching through lens slit 78.

Figure 4:
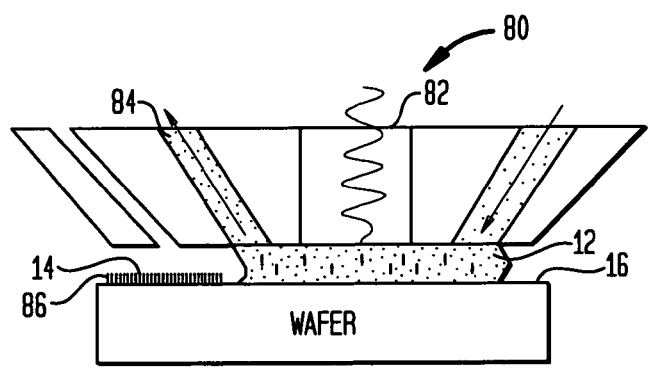
FIG. 4 illustrates diagrammatically a further nozzle arrangement for the formation of a self-assembled coating film from an immersion liquid employed in the immersion lithography of a semiconductor wafer.

As illustrated in the embodiment of a nozzle arrangement 80 in FIG. 4 of the drawings, which is generally similar to that of FIG. 3, in that instance, there is provided a deposition of a self-assembled film of the evaporation control agent 14 from the immersion liquid 12 into which it is already introduced prior to surface contact with the wafer during or after the scanning and etching of wafer surface 16 through the optical lens slit 82. The immersion liquid or water 12 is aspirated under a vacuum through at least one further orifice 84, with a self-assembled film remaining in the liquid on the surface of the wafer. In that instance, the self-assembled film 86 is previously formed by the agent in the stream of the immersion lithographic liquid 12 or water after exposure of the surface 16 for etching or prior to water removal, preventing premature evaporation of the immersion liquid or water from the surface 16 of the semiconductor wafer prior to rinsing.

Figure 5:
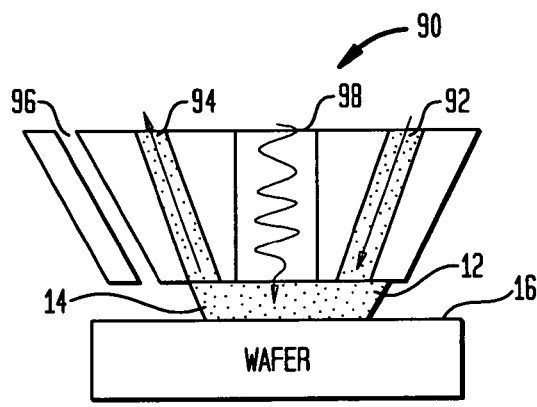
FIG. 5 illustrates diagrammatically yet another nozzle arrangement of generally a showerhead type structure for applying an evaporation-inhibiting or retarding liquid onto the surface of a wafer which is treated in an immersion lithographic etching process.

Represented in FIG. 5 of the drawings is a further preferred embodiment of a nozzle arrangement 90, which is basically in the form of a so-called "showerhead". In that instance, a fluid dispensing or inlet nozzle 92 provides for introduction of an immersion lithographic fluid 12 onto the wafer surface 16, and which liquid contains the chemicals 14 in the form of the evaporation inhibiters, with the water being removed or recirculated through a discharge or removal nozzle orifice 94, with an optional vacuum nozzle 96 being provided. This will permit a liquid or water layer 12 to remain on the surface 16 of the semiconductor wafer subsequent to the etching thereof through the lens slit 98. If desired, the essentially "showerhead" type configuration of the nozzle arrangement 90 illustrated in FIG. 5 of the drawings may be modified to include a separate nozzle (not shown) for the deposition of the evaporation control coating, and in comparison with the location of a typical water dispensing and water suctioning nozzle, the coating deposition nozzle may be located outwardly and, preferably, either on both sides of the nozzle arrangement 90 or concentric with the inlet nozzle 90 for the immersion lithographic liquid 12 so that the coating can be deposited on the wafer surface in any scanning or etching direction.

From the foregoing, it becomes readily apparent that by means of the present invention, there is provided a unique and novel method and arrangement for inhibiting a premature evaporation of an immersion lithographic liquid from the surface of a semiconductor wafer, which is in the process of being immersion lithographically etched in order to provide various etching patterns on the surface thereof.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method for controlling the evaporation of a aqueous immersion liquid which is located on the surface of a semiconductor wafer during the implementing of immersion lithographic etching on said wafer surface; said method comprising:

delivering an evaporation control agent to said immersion liquid and forming a coating of said evaporation control agent on said immersion liquid for retarding the rate of or inhibiting evaporation of said immersion liquid from the surface of said semiconductor wafer during or subsequent to the implementing of said immersion lithographic etching, a layer of said immersion liquid being deposited on said surface of the semiconductor wafer; and said evaporation control agent being separately coated onto said immersion liquid, said evaporation control agent being a fluid possessing a boiling point higher than that of water under normal environmental conditions, and wherein said evaporation control agent is deposited on said immersion liquid so as to form a coating of a Langmuir-Blodgett (LB) type film on the surface of said immersion liquid, said evaporation control agent being dissolved in said immersion liquid and self-assembling on the surface of said immersion liquid to form said evaporation inhibiting or retarding coating the surfaces of said immersion liquid.

2. A method as claimed in claim 1, wherein said evaporation control agent is applied to said immersion liquid in the form of a thin liquid.

3. A method as claimed in claim 1, wherein said evaporation control agent is sprayed on said immersion liquid in the form of a condensed vapor.

4. A method as claimed in claim 1, wherein said evaporation control agent is selectively dispensed in the form of a liquid or spray so as to produce a coating of said control agent on the surface of said immersion liquid.

5. A method as claimed in claim 1, wherein said evaporation control agent has a boiling point within the range of about 200° C. to 300° C.

6. A method as claimed in claim 1, wherein said evaporation control agent comprises a hydrocarbon based light oil, which is selected from the group of materials consisting of hexadecane, alkane alcohols, mixtures of alkanes, and decane, including fluorinated compositions thereof.

7. A method as claimed in claim 1, wherein said evaporation control agent comprises a material selected from the group of materials consisting of perfluorinated 1-octanol, alkane alcohol, fluorocarbon, or surfactants based on acetylene diols.

* * * * *